US006943591B1

(12) United States Patent  (10) Patent No.: US 6,943,591 B1
Hannan et al.  (45) Date of Patent: Sep. 13, 2005

(54) APPARATUS AND METHOD FOR DETECTING A FAULT CONDITION IN A COMMON-MODE SIGNAL

(75) Inventors: Douglas Michael Hannan, Gray, ME (US); Roy L. Yarbrough, Hiram, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 775 days.

(21) Appl. No.: 09/932,061

(22) Filed: Aug. 17, 2001

(51) Int. Cl.[7] ............................................. H03K 5/19
(52) U.S. Cl. ............................. 327/20; 327/18; 327/56
(58) Field of Search ............................ 327/18–20, 50, 327/52, 56, 58, 62–65, 74, 77; 326/9, 13, 326/14, 86

(56) References Cited

U.S. PATENT DOCUMENTS

| | | | |
|---|---|---|---|
| 6,111,431 A * | 8/2000 | Estrada ........................ 326/83 |
| 6,252,435 B1 | 6/2001 | Wu et al. ...................... 327/65 |
| 6,281,699 B1 * | 8/2001 | Bishop ....................... 324/765 |
| 6,320,406 B1 * | 11/2001 | Morgan et al. ................ 326/14 |
| 6,486,695 B1 * | 11/2002 | Nakagawara ................. 326/14 |
| 6,525,559 B1 * | 2/2003 | Wu et al. ...................... 326/30 |
| 6,650,149 B1 * | 11/2003 | Wong .......................... 327/65 |
| 6,781,449 B2 * | 8/2004 | Schrodinger et al. .......... 330/9 |
| 6,791,377 B2 * | 9/2004 | Ilchmann et al. ........... 327/108 |

OTHER PUBLICATIONS

National Semiconductor Corporation, Syed B. Huq/John Goldie, "An Overview of LVDS Technology," Jul. 1998 (6 pages).

National Semiconductor Corporation, "LVDS Owner's Manual, Introduction to LVDS, " 2000 (16 pages).

"IEEE Standard Dictionary of Electrical and Electronic Terms, " 6th Edition 1996, p. 388, "fail-safe circuit" (1 page).

Texas Instruments, "Low Voltage Differential Signaling (LVDS) Technology: The Basics," 2000 (3 pages).

Texas Instruments, "Industry's First LVDS Dual Driver/Receiver Devices Extend Reach of New Data Interface Standard," 2000 (4 pages).

* cited by examiner

Primary Examiner—Tuan T. Lam
Assistant Examiner—Hai L. Nguyen
(74) Attorney, Agent, or Firm—Darby & Darby PC; John W. Branch (57) ABSTRACT

The invention is directed to an apparatus and a method for generating a fault detection signal when a differential signal is in a fault condition. The fault condition arises when the data transmission path in a differential signaling device is either open, shorted, or terminated by an abnormal means, and is such that the inputs are within the valid common-mode range and a valid differential signal cannot be obtained. The invention is buffered from the differential signal source, and an intermediate signal is produced in response to the differential signal. Portions of the intermediate signal are compared to a reference signal, and based on the comparisons, fault condition control signals are produced. A fault detection signal is produced when two fault condition control signals indicate the presence of a fault. The fault detection signal is made available for invocation of a failsafe state.

11 Claims, 11 Drawing Sheets

APPARATUS AND METHOD FOR DETECTING A FAULT CONDITION IN A COMMON-MODE SIGNAL

FIELD OF THE INVENTION

The present invention relates to an apparatus and a method for detecting a fault condition in a common-mode signal, and generating a fault detection signal. The fault detection signal can be used by another device to activate a failsafe condition.

BACKGROUND OF THE INVENTION

Differential signaling has been in existence for many years. For example, teletypes were some of the first equipment to use differential signaling to communicate. One common technique of differential signaling utilizes a current loop to send and receive information between a receiver and transmitter.

According to this differential signaling technique, current is sent in one direction around the loop, or the other direction around the loop, to represent information. A pulse of current in the loop in one direction may correspond to a logic value of "1", while a pulse in the opposite direction may correspond to a logic value of "0."

Current loops have several advantages over other signaling techniques. For example, data sent utilizing a current loop can travel further than data sent through a common RS-232 interface. Current loop differential signaling techniques also provide protection against electrical interference. Additionally, current loop differential signaling techniques can reliably make connections when other communication techniques cannot.

One type of a current loop differential signaling technique is Low Voltage Differential Signaling (LVDS). LVDS is a differential signaling technique commonly used in data transmission systems. LVDS uses relatively low supply voltages; $V_{DD}$ is generally in the range of 2.5 volts and $V_{SS}$ is generally zero. The valid common-mode range for a LVDS receiver is generally between $V_{SS}$+50 mV and $V_{DD}$−50 mV. A low voltage differential signal produced by a line driver typically has peak-to-peak amplitudes in the range from 250 mV to 450 mV. The low voltage swing minimizes power dissipation, while maintaining high transmission speeds. Typical transmission speeds are over 100 Mbps (Mega-bits per second).

SUMMARY OF THE INVENTION

In accordance with the invention, the above and other problems are solved by an apparatus and method for detecting a fault condition in a differential signal and generating a fault detection signal. A fault condition prevents a valid differential signal from being obtained. A fault condition can arise when the data transmission path in a differential signaling device is either open, shorted, or terminated by an abnormal means. The present invention is directed to providing an apparatus and a method for generating a fault detection signal for those fault conditions where the differential signal remains within the proper common-mode range and a valid LVDS signal cannot be obtained.

According to one example of the invention, the invention is buffered from the differential signal source, and an intermediate signal is produced in response to the differential signal. Portions of the intermediate signal are compared to a reference signal. Fault condition signals are produced when amplitude differences between portions of the buffered signal and the reference signal meet predetermined criteria. A fault detection signal is produced when fault condition signals are produced from comparisons from two portions of the buffered signal. The fault detection signal is available to a device for activation of a failsafe state.

According to another example of the invention, the fault detection occurs without loading, altering, or disturbing the differential signal source.

According to another example of the invention, AC components of the intermediate signal are integrated to eliminate rapid signal swings and provide the comparators with a relatively stable input. By integrating the intermediate signal components, the comparators have sufficient time to perform their function without their DC voltages falling prematurely.

According to a further example of the invention, the presence of a fault condition is signaled by a high control signal.

A more complete appreciation of the present invention and its improvements can be obtained by reference to the accompanying drawings, which are briefly summarized below, to the following detailed description of presently preferred embodiments of the invention, and to the appended claims.

DETAILED DESCRIPTION OF THE PREFERRED EMBODIMENT

In the following detailed description of exemplary embodiments of the invention, reference is made to the accompanying drawings, which form a part hereof, and which illustrate specific exemplary embodiments by which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

DEFINITIONS

Throughout the specification and claims, the following terms take the meanings explicitly associated herein, unless the context clearly dictates otherwise. The term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data signal. The meaning of "a", "an", and "the" include plural references. The meaning of "in" includes "in" and "on."

INTRODUCTION

Under certain conditions, a LVDS device may experience a fault condition where its signal path is open, shorted, or terminated by abnormal means. Although the differential signal may be within the valid common-mode range, any one of these conditions alone may prevent a valid signal from being obtained. A fault condition is produced because the differential signal's peak-to-peak signal swing may be very low or near zero (i.e., a short circuit AC condition.). The output signal is unknown when the device does not receive a valid input signal. An unknown output signal can create bad data or signals.

The apparatus and method of the present invention is directed toward detecting a fault condition in common-mode differential signals and generating a fault detection signal for certain types of faults. The present invention is directed to providing an apparatus and a method for generating a fault detection signal for those fault conditions where the differential signal remains within the proper common-mode range and a valid LVDS signal cannot be obtained. As used herein, the terms "fault" and "fault condition" include the situation when a data transmission path in a differential signaling device is open, shorted, or terminated by an abnormal means while the differential signal remains within the proper common-mode range. This invention does not address other forms of differential signaling faults, for example an open condition where the differential signal exceeds the proper common mode range. The instant invention only detects faults occurring within the common-mode range. Therefore, the term "normal condition" means those situations not included within "fault condition," which includes those instances when a valid differential signal can be obtained and when a fault occurs outside the common-mode range. This definition is a broad definition of normal and is intended to include both conditions not detected by the invention and conditions where valid signals are obtained.

The type of transistors is generally not designated in the drawings, specifications, and claims herein. For the purposes of this invention, p-type and/or n-type transistors may be used unless expressly indicated otherwise. The transistors may be bipolar devices, MOS devices, GaAsFET devices, JFET devices, as well as one or more components that are arranged to provide the function of transistors.

Referring to the drawings, like numbers indicate like parts throughout the views. Additionally, a reference to the singular includes a reference to the plural unless otherwise stated or inconsistent with the disclosure herein.

Briefly described, a LVDS fault condition detector generates a control signal when a LVDS device experiences a fault condition. The control signal, termed a fault detection signal herein, can be used by another apparatus to invoke a known, valid state. In one embodiment, the LVDS fault condition detector employs an input buffer that isolates a LVDS signal from any upstream device, and creates single-ended signals representing the LVDS inputs. Each single-ended signal is shifted to a level appropriate for comparators. During a normal LVDS condition, AC components of the single-ended signal are integrated to provide relatively stable input to the comparators. The comparators separately compare each single-ended signal to a reference signal, and generate a control signal for each single-ended signal. The magnitude of a control signal depends on whether the single-ended signal is above or below the reference signal. A high comparator signal represents a normal condition and a low comparator signal represents a potential fault condition. In a normal condition, at least one single-ended signal is above the reference signal, and results in one high comparator signal being generated. In a fault condition, both single-ended signals are below the reference signal, and both comparator signals are low. Lastly, the output stage of the LVDS fault condition detector produces a low output stage control signal in a normal condition, and a high output stage control signal in a fault condition. The high output stage control signal constitutes a fault detection signal and is used by a downstream device to invoke the failsafe condition and retain a valid LVDS signal in a fault condition.

The output stage may be arranged to provide a high signal in a normal condition and a low signal when a fault condition exists.

ILLUSTRATIVE ENVIRONMENT

Figure 1:
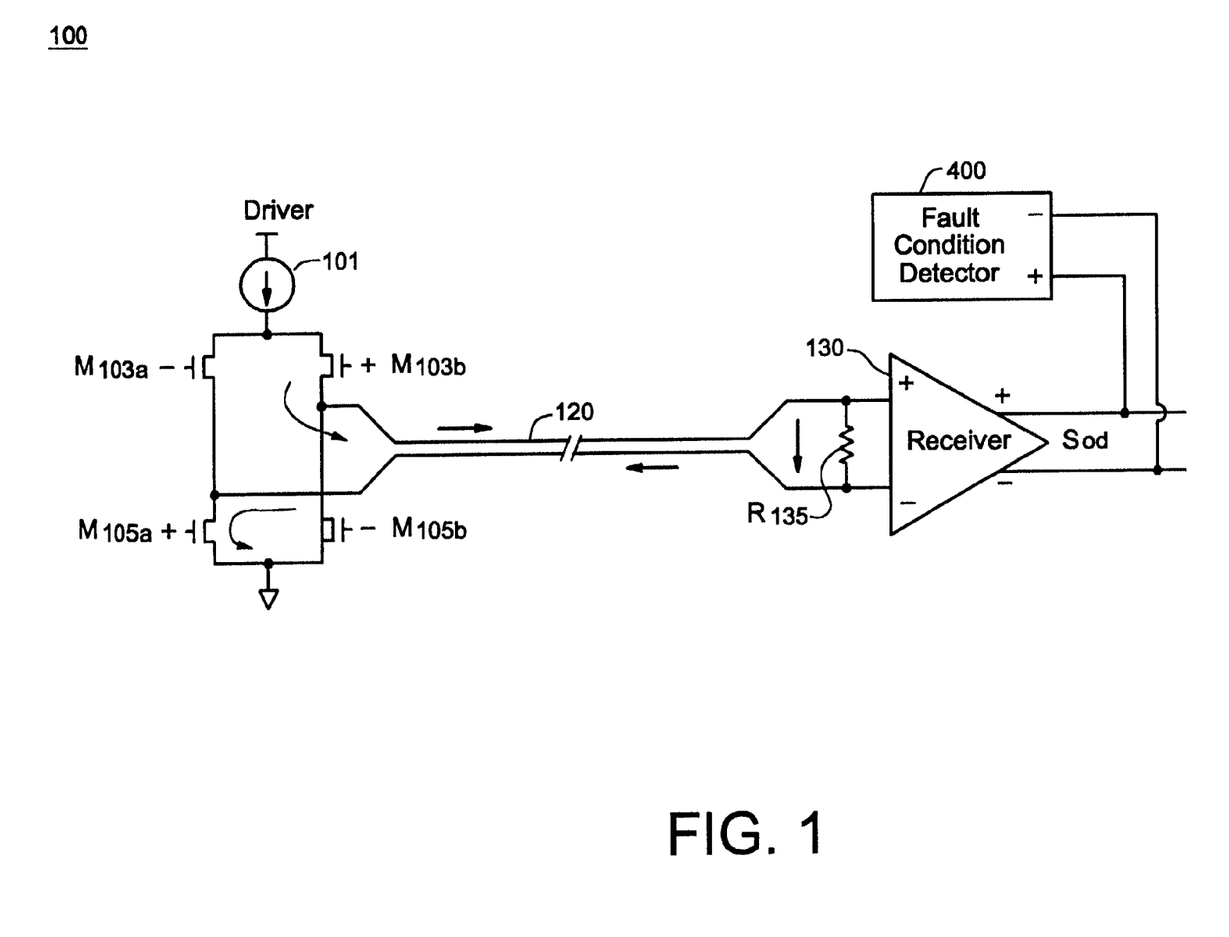
FIG. 1 illustrates a LVDS driver and receiver.

FIG. 1 is an exemplary schematic diagram illustrating a LVDS driver and receiver system being monitored by the fault condition detector. The system includes driver 101, receiver 130, differential communication line pair 120, resistive load $R_{135}$, and fault condition detector 400.

Driver 101 includes a current source and two pairs of transistors, $M_{103b}$ and $M_{105a}$ driving current in one direction, and $M_{103a}$ and $M_{105b}$ driving current in the opposite direction. A typical current produced by driver 101 could be in the range of 4.0 mA. Differential line pair 120 couples driver 101 to receiver 130. Receiver 130 has a high input impedance and can be any device configured to accept a LVDS input. Resistive load $R_{135}$ is a termination resistive load that is connected across the LVDS inputs of receiver 130, and can be in the range of 100 ohms. Receiver 130 detects a voltage signal that is driven across resistive load $R_{135}$. When driver 101 switches directions, the current flow changes direction across $R_{135}$, and the signal across $R_{135}$ changes polarity. Receiver 130 detects the change in polarity as a "high" or "low" logic state (i.e., logic "1" or logic "0.")

Fault condition detector 400 monitors the differential signal ($S_{od}$) output by receiver 130 without significantly loading it.

Figure 2:
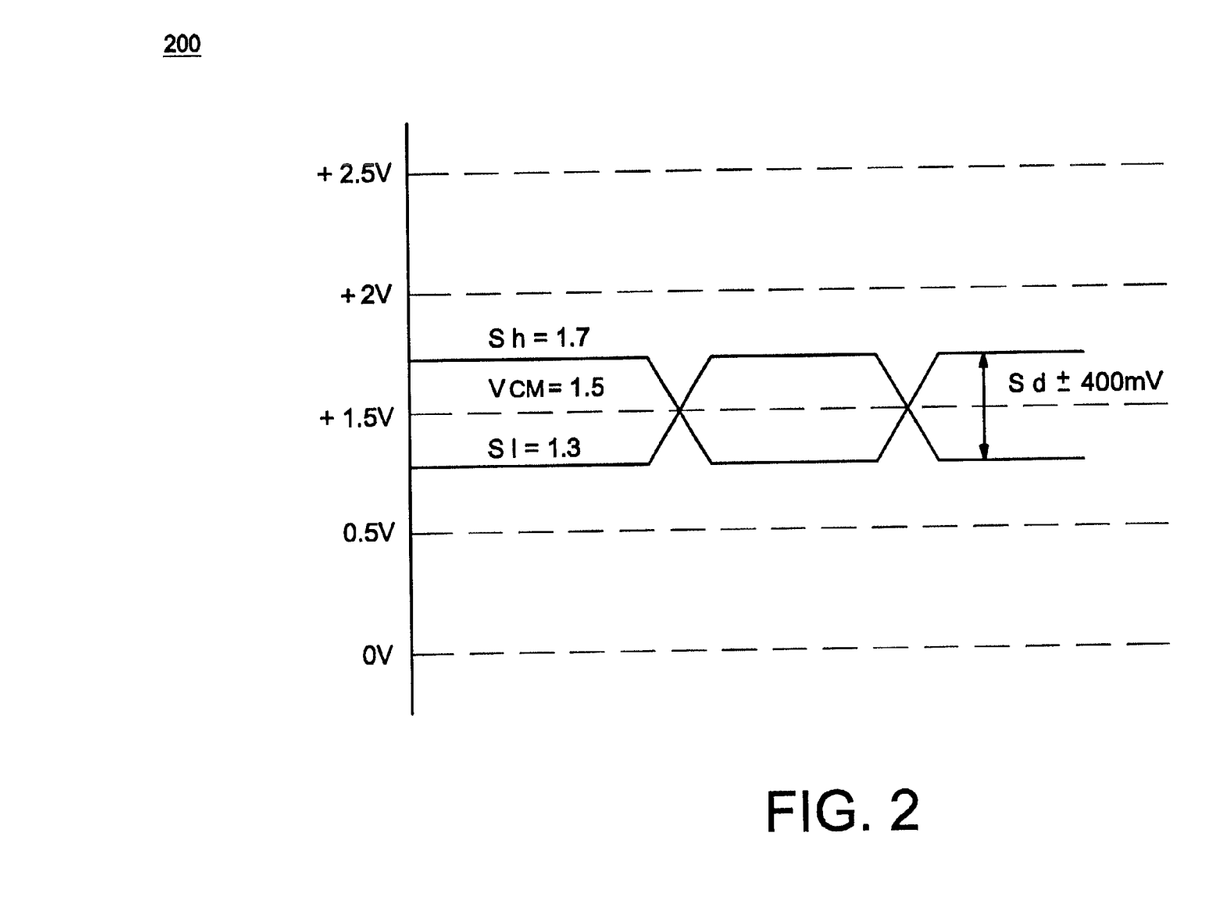
FIG. 2 is a graph generally illustrating LVDS signal swing.

FIG. 2 illustrates a typical LVDS signal swing that may appear across resistive load $R_{135}$ at the input terminals of receiver 130 shown in FIG. 1. For example, driving 4.0 mA through $R_{135}$ will produce a 400 mV differential signal across the input terminals of receiver 130. A typical LVDS system may have a common-mode voltage ($V_{CM}$) between +0.2V and +2.2V. As shown in FIG. 2, a typical LVDS signal may have a common-mode voltage ($V_{CM}$) centered at 1.5 V, a high output signal level ($S_h$) at 1.7V, and low signal output level ($S_l$) at 1.3V, yielding a differential signal ($S_d$) with a 400 mV peak-to-peak.

In the present invention, a fault condition is determined to occur when the voltage difference between $S_h$ and $S_l$ is less than 100 mV. This may occur when there is an open or a shorted conduction path in differential communication line pair 120, or when the conduction path or the input to receiver 130 is terminated other than by resistive load $R_{135}$. Receiver 130 does not receive a valid logic state when a fault condition exists for reasons previously discussed. For the present invention, a fault condition is determined to occur when the voltage difference between $S_h$ and $S_l$ is less than approximately 100 mV. This may occur when there is an open or a shorted conduction path in differential communication line pair 120, or when the conduction path or the input to receiver 130 is terminated other than by resistive load $R_{135}$. Receiver 130 does not receive a valid logic state when a fault condition exists. The present invention detects fault conditions that occur within the allowable common-mode range of the LVDS system.

Figure 3:
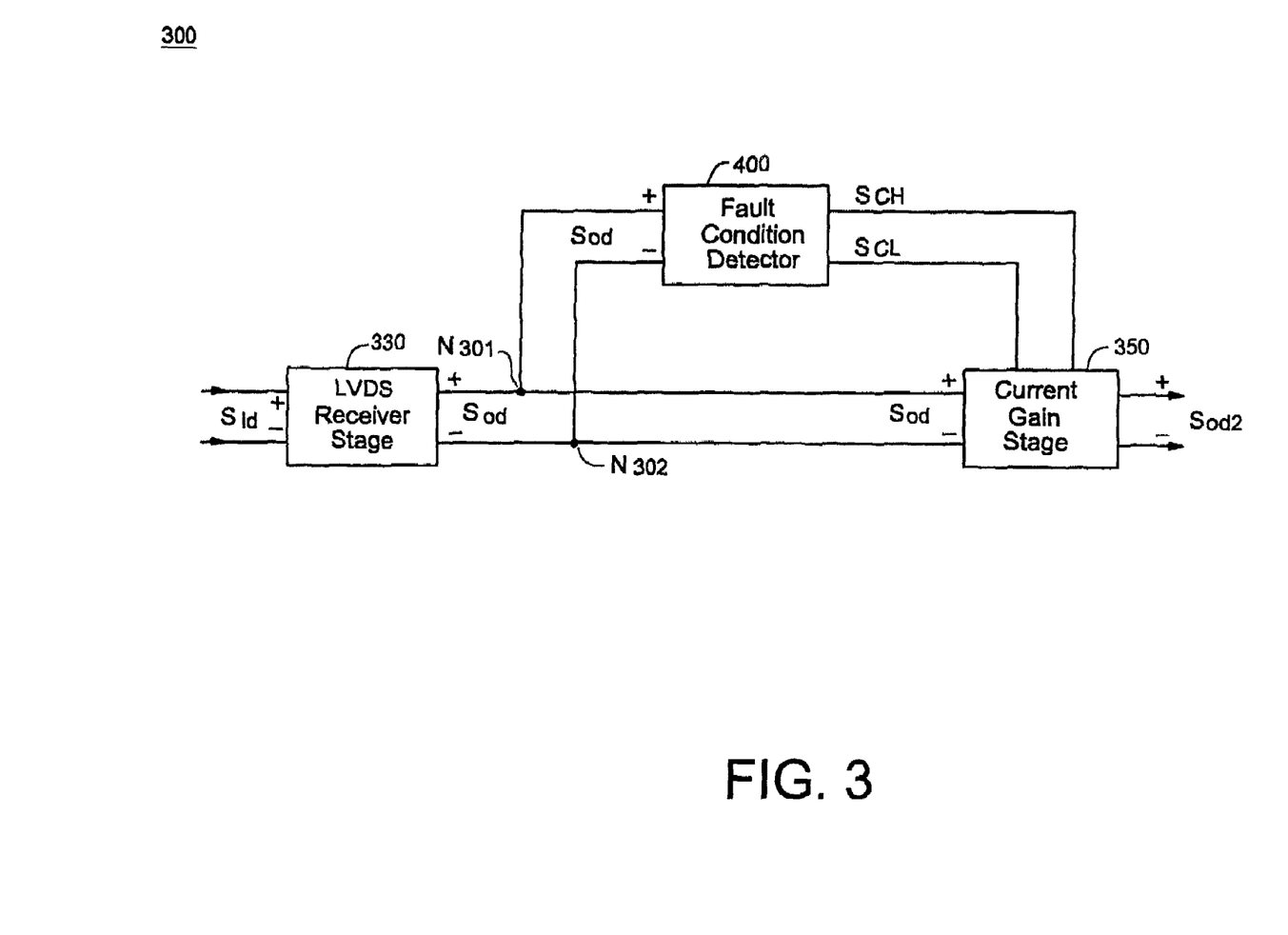
FIG. 3 is a block diagram generally illustrating an exemplary operating environment.

FIG. 3 is a block diagram generally illustrating an exemplary operating environment for a LVDS fault condition detector. A typical operating environment can include LVDS receiver stage 330, fault condition detector 400, current gain stage 350, and appropriate couplers (not shown). LVDS receiver stage 330, fault condition detector 400, and current gain stage 350 can each be a separate device, or some or all of the devices may be combined into one or more single devices.

LVDS receiver 330 has a differential input that is arranged to receive differential input signal (+$S_{id}$, −$S_{id}$). The LVDS receiver (330) produces a differential output signal (+$S_{od}$, −$S_{od}$) at nodes $N_{301}$ and $N_{302}$ respectively. Fault condition detector 400 has a differential input that is arranged to receive a differential signal (+$S_{od}$, −$S_{od}$) from nodes $N_{301}$, and $N_{302}$ respectively. Fault condition detector 400 provides a pair of control signals ($S_{CH}$, $S_{CL}$) in response to its differential input. Current gain stage 350 receives control signals ($S_{CH}$, $S_{CL}$) and the differential output signal (+$S_{od}$, −$S_{od}$). Current gain stage 350 produces a differential output signal (+$S_{od2}$, −$S_{od2}$) in response to its inputs.

LVDS receiver stage 330 can be any apparatus or portion of an apparatus capable of receiving a LVDS signal, represented as $S_{id}$. LVDS receiver stage 330 preferably has a high input impedance. In operation, the input differential signal $S_{id}$ is produced across resistive load $R_{135}$ (see FIG. 1). LVDS receiver stage 330 receives differential signal $S_{id}$, rejects any common-mode noise in $S_{id}$, and produces an output differential signal ($S_{od}$) that is characterized by a relatively constant common-mode voltage. Fault condition detector 400 receives differential signal $S_{od}$ as inputs $S_{ih}$ and $S_{il}$. Fault condition detector 400 outputs control signals $S_{CH}$ and $S_{CL}$ to current gain stage 350. The downstream device, illustrated by current gain stage 350 receives differential signal $S_{od}$ and fault condition control signals ($S_{CH}$, $S_{CL}$) as inputs, and outputs signal $S_{od2}$.

The LVDS fault condition detector 400 generates either a normal condition control signal or a fault condition control signal (fault detection signal). The control signals indicate normal or fault condition to the downstream device. A normal condition control signal is generated when LVDS receiver 330 outputs a valid LVDS signal ($S_{od}$). In the event of a fault, fault condition detector 400 provides control signal $S_{CH}$ greater than $S_{CL}$ as a fault detector signal. For example, in a normal condition, fault condition control signal $S_{CL}$ may be greater than $S_{CH}$ by roughly 600 mV, and in a fault condition, fault condition control signal $S_{CH}$ may be greater than $S_{CL}$ by roughly 600 mV, constituting a fault detection signal.

In a fault condition, current gain stage 350 receives fault condition control signal $S_{CH}$ greater than $S_{CL}$, constituting a fault detection signal, and invokes the failsafe condition by outputting a logic high signal as $S_{od2}$. A "failsafe condition" means a specific output by an apparatus of a predetermined value upon the occurrence of a fault condition. An example of a failsafe condition is blinking a traffic light red in all directions when a fault condition occurs. When the fault condition ends, fault condition control signal $S_{CH}$ becomes less than $S_{CL}$, and current gain stage 350 outputs signal $S_{od2}$ as a function of signal $S_{od}$.

FIG. 3 reflects a preferred embodiment with fault condition detector 400 coupled signal downstream of LVDS receiver stage 330. This allows LVDS receiver 330 to function normally without being altered or disturbed by fault condition detector 400. In an alternative embodiment, fault condition detector 400 is located upstream of LVDS receiver stage 330 and receives signal $S_{id}$ as its input signal.

Figure 4:
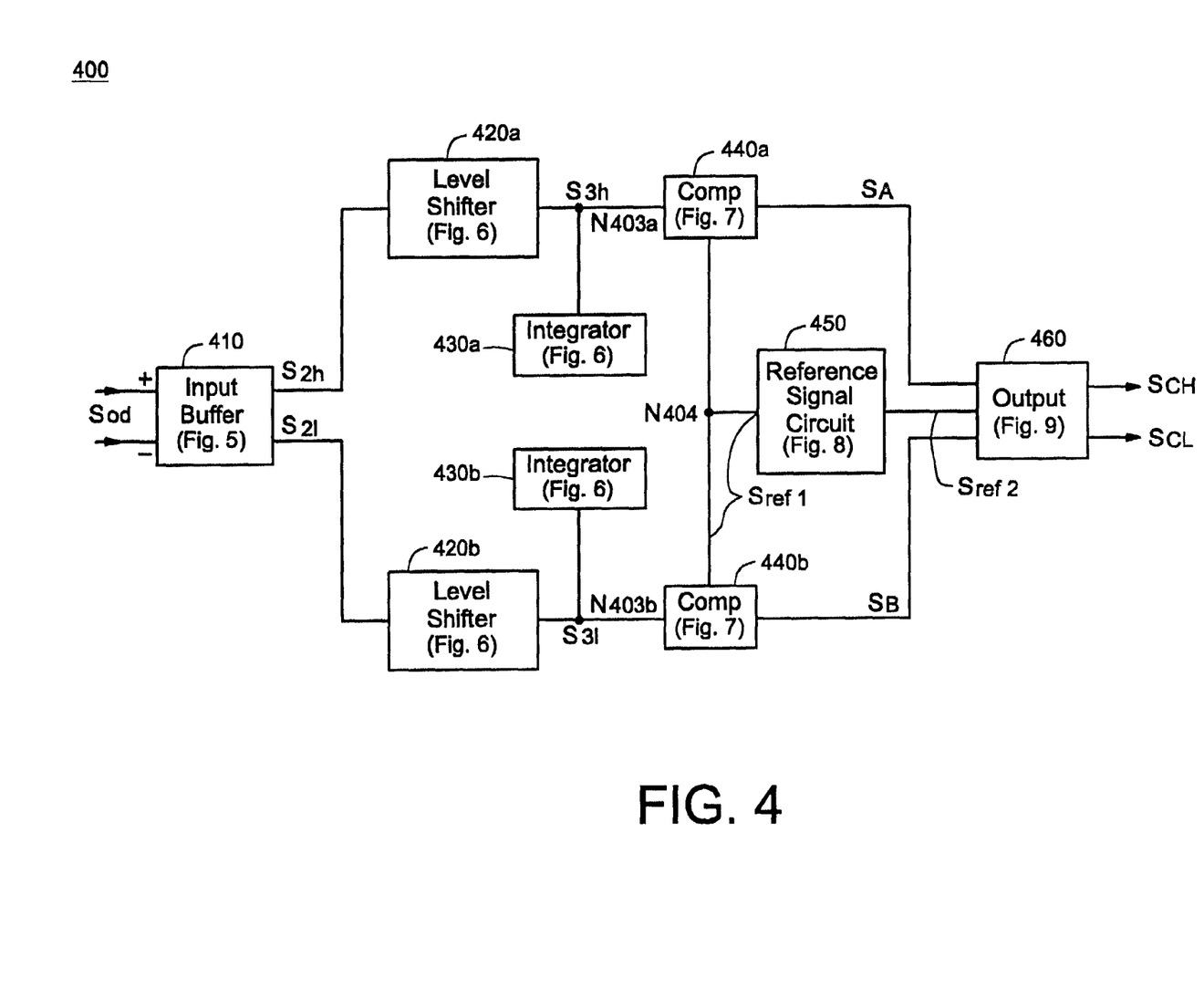
FIG. 4 is a block diagram generally illustrating an exemplary apparatus overview.

FIG. 4 shows a block diagram for LVDS fault condition detector 400, generally illustrating an embodiment of the invention. LVDS fault condition detector 400 includes input buffer 410, two level shifters 420a and 420b, two integrators 430a and 430b, two comparators 440a and 440b, reference signal supply 450, and output stage 460.

Input buffer 410 has one signal input coupled to one part of the LVDS differential signal ($S_{od}$) and one signal input coupled to another part of LVDS differential signal ($S_{od}$). Input buffer 410 provides an output that is coupled to an input of level shifter 420a, and another output that is coupled to an input of level shifter 420b. Level shifter 420a has an output coupled to node N403a. Integrator 430a is coupled to node N403a. Comparator 440a has an output that is coupled to node N403a, and another input that is coupled to node N404. Level shifter 420b has an output coupled to node N403$_b$. Integrator 430b is coupled to node N403b. Comparator 440b has an input that is coupled to node N403b, another input that is coupled to node N404. Reference signal supply 450 has one output coupled to node N404, and another output coupled to output 460. Output stage (460) has inputs coupled to comparators 440a and 440b, and the $S_{ref2}$ output of Reference Signal Circuit 450, and outputs differential signal ($S_{OH}$, $S_{OL}$).

In operation, input buffer 410 receives differential input signal $S_{od}$ ($S_{2h}$), $S_{2l}$). Input buffer 410 is configured to have a relatively high input impedance to prevent LVDS fault condition detector 400 from loading, altering, or disturbing the source of input signal $S_{od}$. Input buffer 410 also provides isolation from any external LVDS common-mode changes that might be interpreted by the LVDS fault condition detector 400 as a fault condition. Input buffer 410 may be configured to provide additional signal gain. Input buffer 410 outputs in-phase, single-end signals $S_{2h}$ and $S_{2l}$ to level shifters 420a and 420b, respectively.

In operation, level shifters 420a and 420b are arranged to receive in-phase, single-end signals $S_{2h}$ and $S_{2l}$, respectively, and to shift these signals to a level appropriate for comparators 440a and 440b. Level shifters 420a and 420b output signals $S_{3h}$ and $S_{3l}$ to integrators 430a and 430b, and to comparators 440a and 440b, respectively. Integrators 430a and 430b are included because many devices used for comparators begin to operate as integrators when the LVDS switching speeds increase dramatically. The function of integrators 430a and 430b becomes significant when LVDS switching speeds approach AC frequencies in the range of approximately 400 MHz. In a preferred embodiment of the invention, integrators 430a and 430b are configured to average the AC component of signals $S_{3h}$ and $S_{3l}$ present at nodes N403a and N403b, respectively.

The integrators function as a "speed trap," generating an average of the signal's peak value, and eliminating rapid signal swings. When transient signals approach a range of approximately 400 MHz, the gate voltages of comparators 440a and 440b start falling. Averaging effectively slows down the AC components of signals $S_{3h}$ and $S_{3l}$ by holding signals $S_{3h}$ and $S_{3l}$ at average peak values. This provides a relatively stable input signal to comparators 440a and 440b, and allows them sufficient time to perform their function. The transistors used in comparators 440a and 440b may be very fast, and without averaging or a "speed trap," $S_{3h}$ or $S_{3l}$ signal swings in AC domain could cause a comparator to generate an erroneous fault detection signal or glitches.

In further operation, reference signal supply 450 provides reference signals $S_{ref1}$ and $S_{ref2}$. Reference $S_{ref1}$ is provided to comparators 440a and 440b at node N404. Reference $S_{ref2}$ is provided to output stage 460.

In further operation, comparators 440a and 440b receive signals $S_{3h}$, $S_{3l}$, and $S_{ref1}$, and are arranged to compare reference signal $S_{ref1}$ to signals $S_{3h}$ and $S_{3l}$. Each comparator (440a, 440b) generates a control signal ($S_A$, $S_B$) based on the signals received by it. The magnitude of the comparator control signal depends on whether the input signal is above or below reference signal $S_{ref1}$. In normal LVDS operating mode, at least one of signals $S_{3h}$ and $S_{3l}$ is above reference signal $S_{ref1}$. This results in at least one high control signal being generated by a comparator. In a fault condition, both control signals will be low. For example, control signal $S_A$ will be high when $S_{3h}$ is above reference signal $S_{ref1}$ (normal condition). Control signal $S_A$ will be low when $S_{3h}$ is below reference signal $S_{ref1}$ (possible fault condition). Comparator 440b functions in a manner similar to comparator 440b.

In further operation, output stage 460 receives comparator signals $S_A$ and $S_B$ from comparators 440a and 440b, respectively, and reference signal $S_{ref2}$ from reference signal supply 450. Output stage 460 generates control signals $S_{CH}$ and $S_{CL}$. Output stage 460 is configured to generate a signal such as $S_{CL}>S_{CH}$ to signal to a downstream device that a normal condition (non-fault condition) exists. Output stage 460 is configured to generate a fault condition control signal such as $S_{CH}>S_{CL}$, constituting a fault detection signal, to inform a downstream device that a fault condition exists in $S_{od}$. The fault condition may originate either in LVDS receiver stage 330 or upstream. The fault detection signal $S_{CH}>S_{CL}$ can be used by a device to invoke a failsafe condition.

For the purposes of illustrating an embodiment of the invention, a LVDS differential signal ($S_{od}$) is in a fault condition when $S_{od}$ has a magnitude that is less than 100 mV peak-to-peak. For the purposes of further illustrating an embodiment of the invention, the difference between fault condition control signals $S_{CL}$ and $S_{CH}$ is approximately 600 mV. In a normal condition (non-fault condition) when the LVDS signal differential magnitude is 100 mV or more (see FIG. 2), LVDS fault condition detector (400) provides an fault condition control signal such that $S_{CL}$ is greater than $S_{CH}$ by approximately 600 mV. In a fault condition (when the LVDS signal differential magnitude is below 100 mV), LVDS fault condition detector (400) is configured to provide a fault condition control signal such that $S_{CH}$ is greater than $S_{CL}$ by approximately 600 mV. This latter fault condition control signal constitutes a fault detection signal, and indicates to a downstream device that a fault condition exists.

In an alternative embodiment, integrators 430a and 430b, and level shifters 420a and 420b are omitted when LVDS switching speeds are sufficiently slow such that the comparators do not produce a false fault condition.

Figure 8:
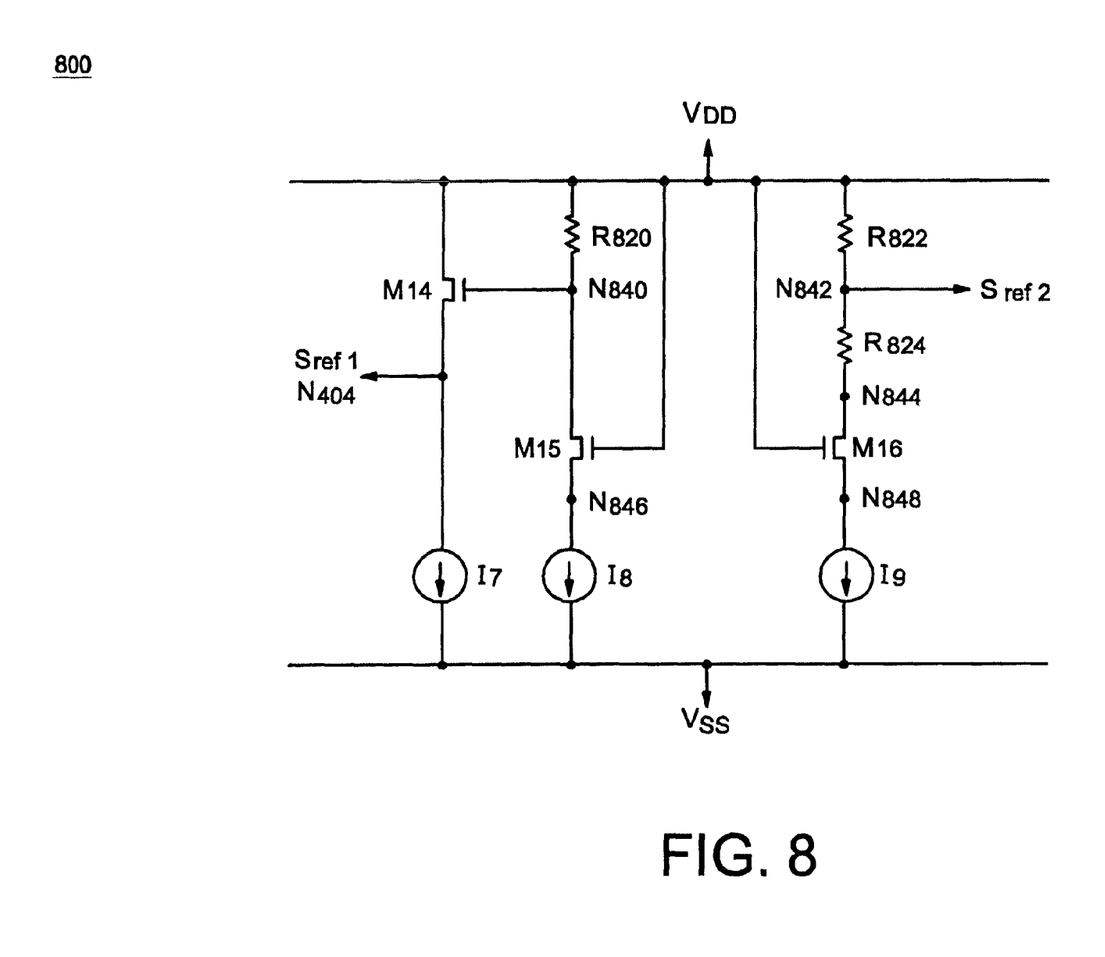
FIG. 8 is a schematic diagram of an exemplary reference signal circuit.
Figure 9:
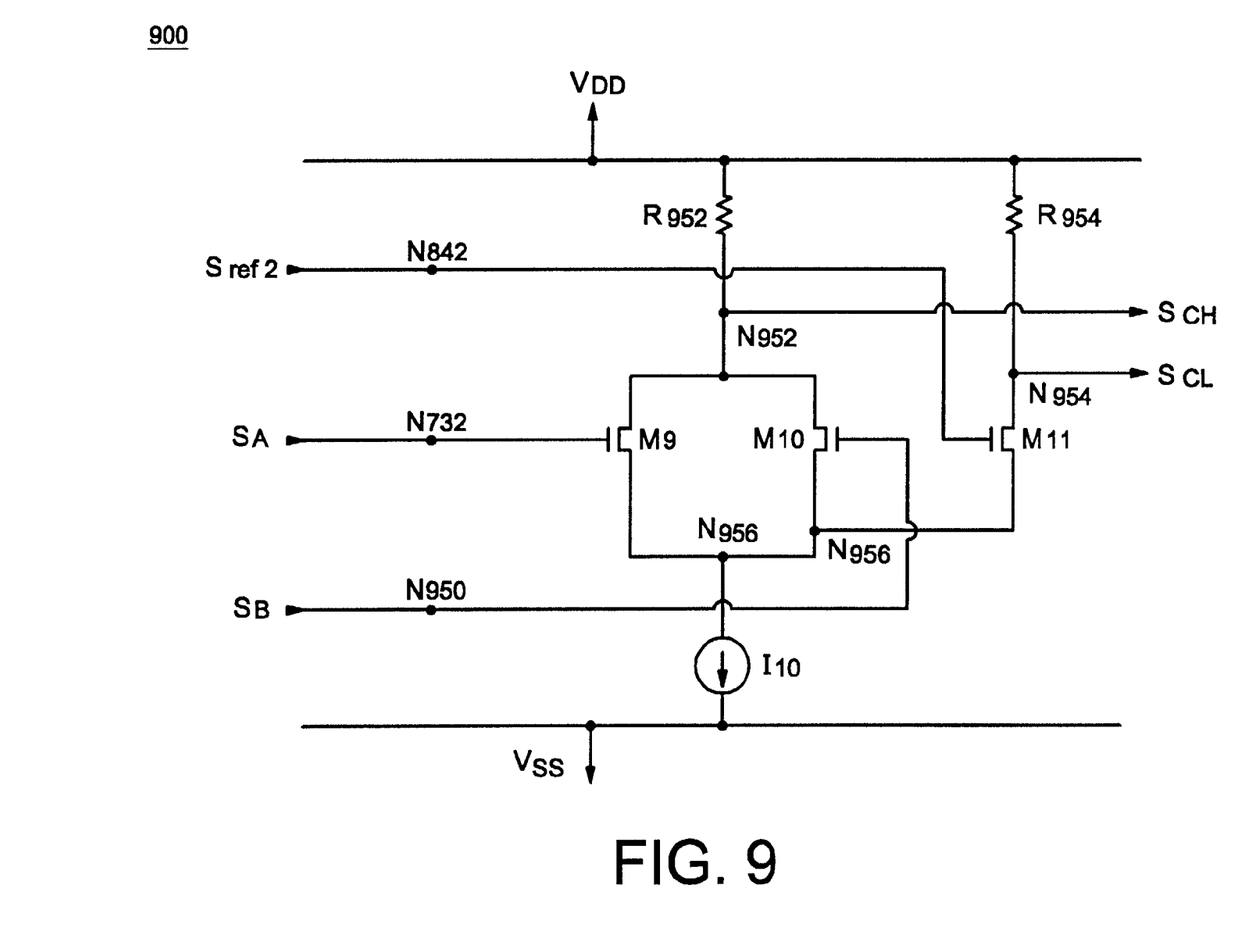
FIG. 9 is a schematic diagram of an exemplary output circuit.
Figure 10A:
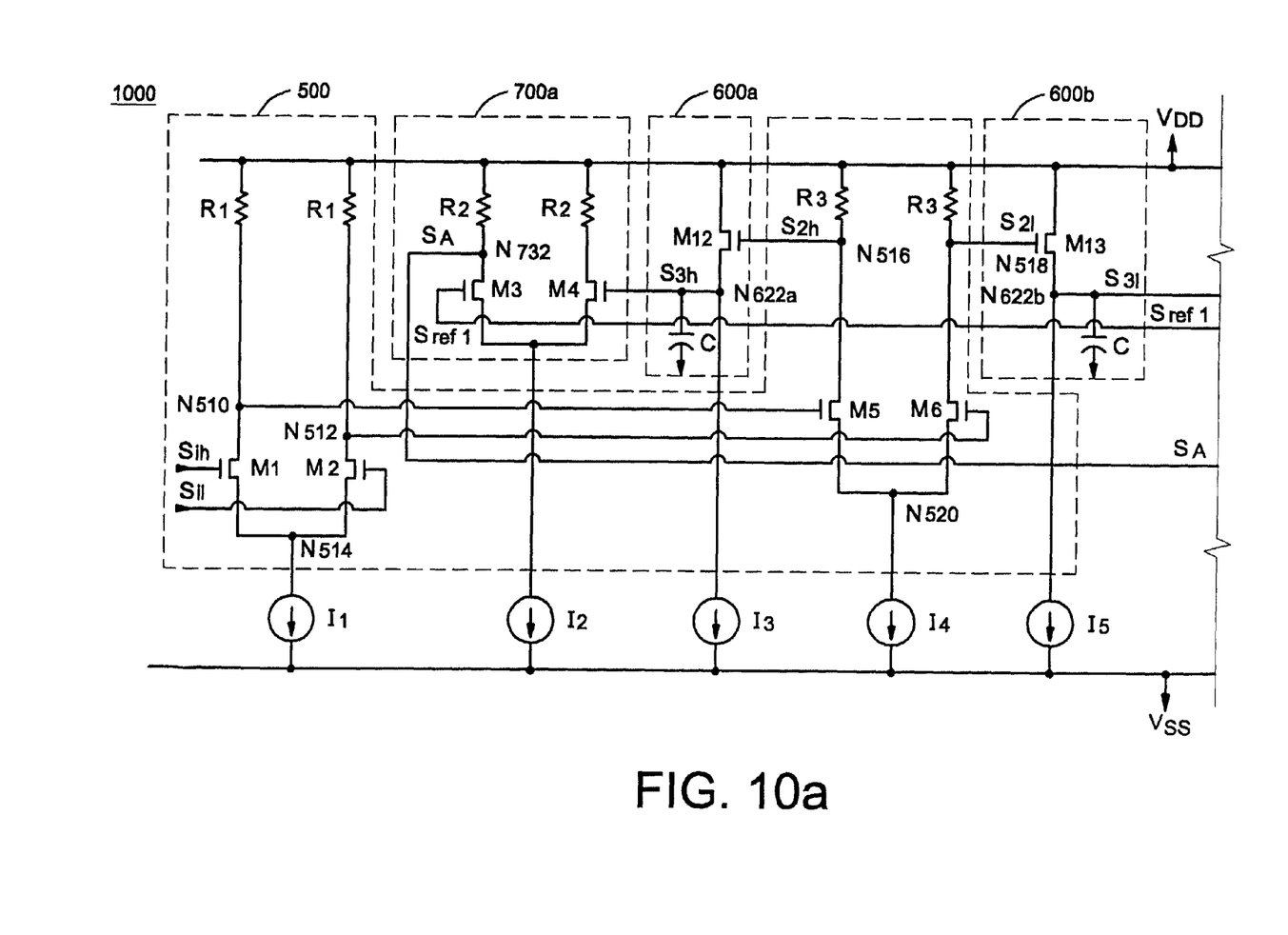
FIG. 10 is a schematic diagram of an exemplary embodiment of the invention.
Figure 10B:
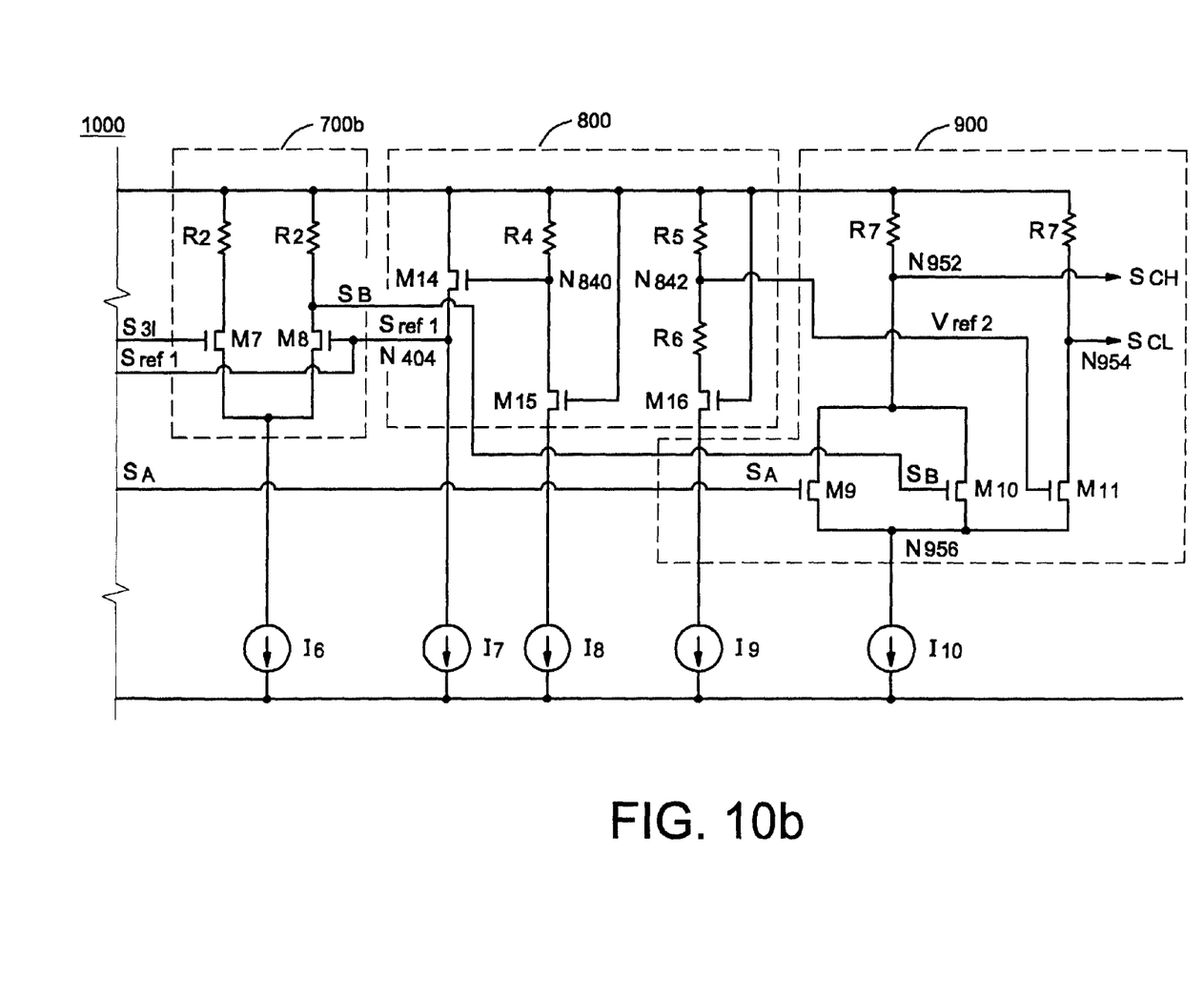

FIGS. 5–10 illustrate preferred embodiments of the invention. FIGS. 6–9 illustrate a fault condition detector processing the $S_{2h}$ side of a LVDS differential signal. The components processing the $S_{2l}$ side of a LVDS differential signal are substantially similar, and are illustrated in FIG. 10.

Figure 5:
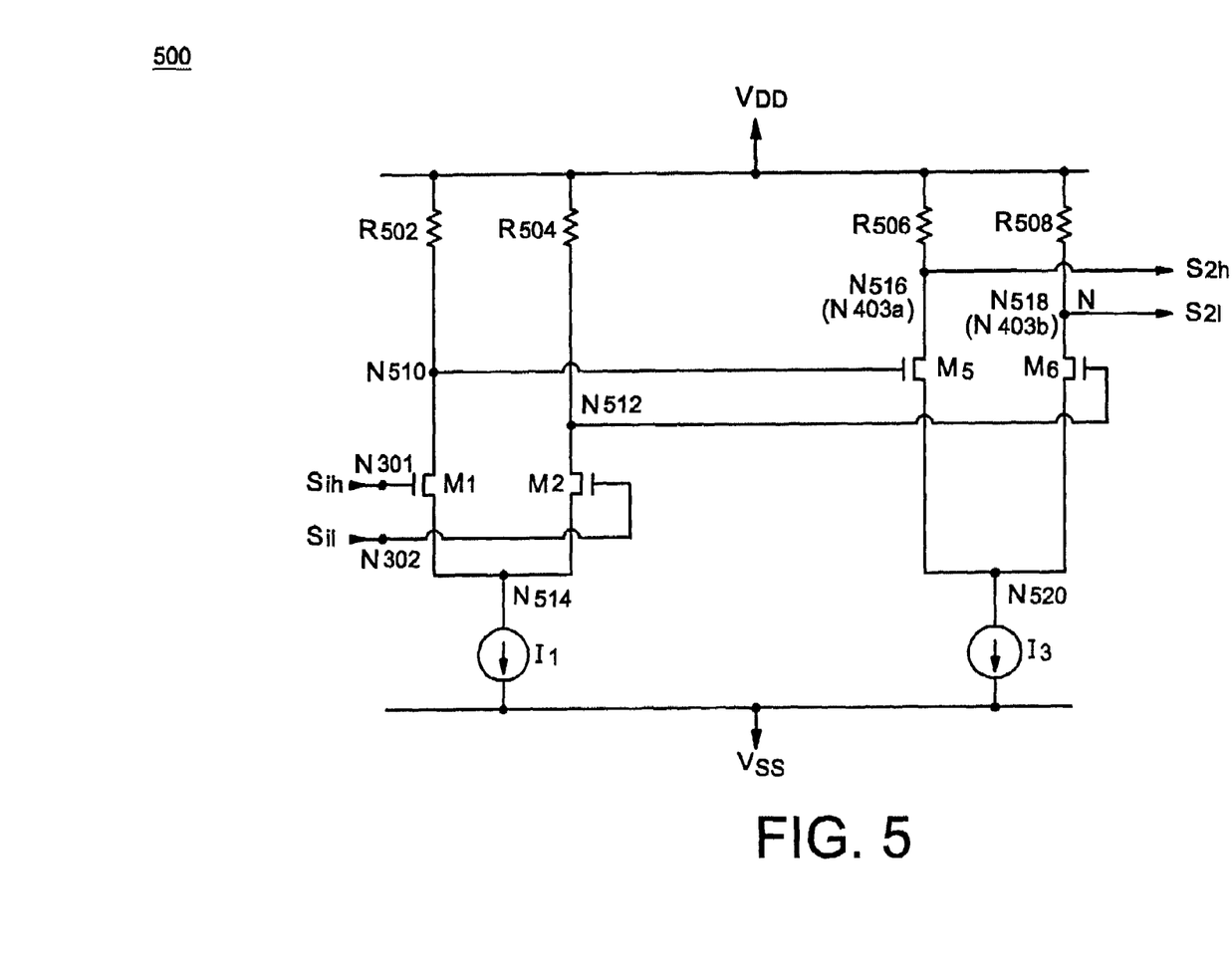
FIG. 5 is a schematic diagram of an exemplary input buffer.

FIG. 5 is a schematic diagram of an exemplary input buffer 500 according to one embodiment of the invention. As shown in FIG. 5, input buffer 500 includes resistive loads $R_{502}$, $R_{504}$, $R_{506}$, and $R_{508}$; transistors $M_1$, $M_2$, $M_5$, and $M_6$; and current sources $I_1$ and $I_3$.

Resistive loads $R_{502}$, $R_{504}$, $R_{506}$, and $R_{508}$ are coupled between local power supply $V_{DD}$ and nodes $N_{510}$, $N_{512}$, $N_{516}$, and $N_{518}$, respectively. Transistor $M_1$ has a gate coupled to node N301 ($S_{ih}$), a drain coupled to node $N_{510}$, and a source coupled to node $N_{514}$. Transistor $M_2$ has a gate coupled to node N302 ($S_{il}$), a drain coupled to node $N_{512}$, and a source coupled to node $N_{514}$. Current source $I_1$ is coupled between node $N_{514}$ and local power supply $V_{SS}$. Transistor $M_5$ has a gate coupled to node $N_{510}$, a drain coupled to node $N_{516}$, and a source coupled to node $N_{520}$. Transistor $M_6$ has a gate coupled to node $N_{512}$, a drain coupled to node $N_{518}$, and a source coupled to node $N_{520}$. Current source $I_2$ is coupled between node $N_{520}$ and local power supply $V_{SS}$. Transistors $M_1$ and $M_2$ form a first differential pair and transistors $M_5$ and $M_6$ form a second differential pair.

In operation, the LVDS differential input signal ($S_{ih}$, $S_{il}$) is applied to the gates of the first differential pair of transistors $M_1$ and $M_2$. When $S_{ih}$ rises above $S_{il}$, transistor $M_1$ has a larger gate-to-source voltage than that for transistor $M_2$, causing $M_1$ to drive more current than transistor $M_2$. The higher current through $M_1$ and resistive load $R_{502}$ pulls the voltage at node $N_{510}$ lower, and the lower current through $M_2$ and resistive load $R_{504}$ pulls the voltage at node $N_{512}$ higher. When the voltage at node $N_{510}$ is lower than the voltage at node $N_{512}$, the gate-to-source voltage applied to second transistor $M_5$ decreases below the gate-to-source voltage applied to transistor $M_6$. Less current is steered through $M_5$ and $R_{506}$, and more current is steered through transistor $M_6$ and $R_{508}$ such that signal $S_{2h}$ rises toward $V_{DD}$ and signal $S_{2l}$ falls toward $V_{SS}$. Signals $S_{2h}$ and $S_{2l}$ are in-phase with respect to signals $S_{ih}$ and $S_{il}$. When $S_{il}$ rises above $S_{ih}$, more current is steered through transistor $M_2$ than through transistor $M_1$, and the process is reversed.

In a preferred embodiment, the first and second differential transistor pairs are relatively small compared to the other transistors in the LVDS fault condition detector 400, and $M_1$ and $M_2$ are smaller than $M_5$ and $M_6$. Drain resistive loads $R_{502}$ and $R_{504}$ typically are approximately equal, and are matched to provide approximately equal current through $M_1$ and $M_2$ when the input signals ($S_{ih}$, $S_{il}$) are equal. Current sources $I_1$ and $I_3$ can be any type of current source capable of supplying a relatively constant current to the other components of input buffer 500. Transistors $M_1$ and $M_2$ have a relatively high input impedances such that they do not load down the source of signals $S_{ih}$ and $S_{il}$, and provide isolation from any external LVDS common-mode changes that might be interpreted by a LVDS fault condition detector 400 as a fault condition.

Figure 6:
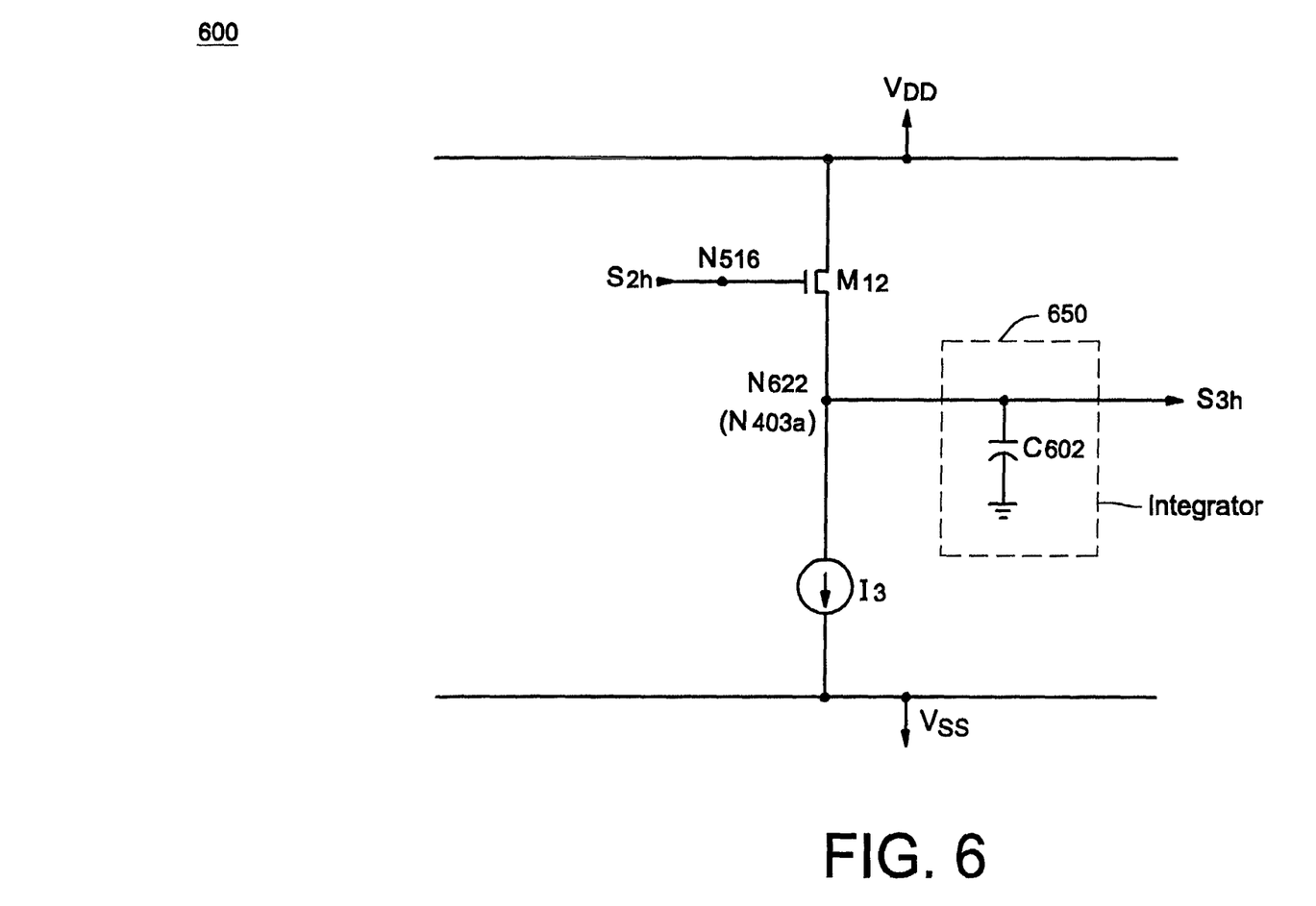
FIG. 6 is a schematic diagram of an exemplary level shifter and integrator.

FIG. 6 is a schematic diagram of an exemplary level shifter 600 and integrator 650 according to one embodiment of the invention. A preferred embodiment of a LVDS fault condition detector employs two, separate level shifters 420a and 420b, and two, separate integrators 430a and 430b. Level shifter 420a and integrator 430a form part of the path analyzing $S_{ih}$, while level shifter 420b and integrator 430b form part of the path analyzing $S_{il}$ (see FIG. 4). FIG. 6 illustrates a preferred embodiment of a level shifter and an integrator.

In a preferred embodiment, level shifter 600 comprises transistor $M_{12}$, and current source $I_3$. Transistor $M_{12}$ has a gate coupled to node $N_{516}$, a drain coupled to local power supply $V_{DD}$, and a source coupled to node $N_{622}$. Current source $I_3$ is coupled between $N_{622}$ and local power supply $V_{SS}$. In operation, transistor $M_{12}$ operates as a source follower (level shifter) in the DC situation with $I_3$ providing a pull-down current source. Signal $S_{2h}$ is coupled to the gate of $M_{12}$. In operation, the source of $M_{12}$ tracks gate signal $S_{2h}$, and produces a laterally shifted (stepped down) signal $S_{3h}$ at node $N_{622}$. $M_{12}$ is also configured to provide a very fast low-to-high transition time and a very slow high-to-low transition time in the transient domain.

In a preferred embodiment, integrator 650 comprises capacitive circuit $C_{602}$, which is coupled between node $N_{622}$ and signal ground. In operation, capacitive circuit $C_{602}$ is configured to operate as an integrator when the LVDS switching speeds approach high frequencies (i.e., in the range of approximately 700 to 800 MHz). Capacitive circuit $C_{602}$ is configured to provide an average signal $S_{3h}$ at node $N_{622}$ (See also node $N_{403a}$ at FIG. 4). Capacitive circuit $C_{602}$ functions as a "speed trap," generating an average of the signal's value, and eliminating rapid signal swings. For example, without integrator 650, the signal at node $N_{622}$ will rapidly fluctuate between $V_{SS}$ and $(V_{2h}-V_T)$ as $M_{12}$ turns on and off. The rapid fluctuation may cause comparator 440a to have an output that rapidly oscillates between high and low.

The comparators determine when the signal level of the differential input is in a normal condition. Since at least one comparator must provide an output in a normal condition, both comparators turning off at the same time may cause a momentary "glitch" in the output, giving a false fault detection signal. The transistors of comparators 440a and 440b are very fast, and without averaging or without a "speed trap," signal $S_{3h}$ may cause a comparator to generate an erroneous fault condition signal.

When $M_5$ is off (see FIG. 5), node $N_{516}$ ($S_{2h}$) will be pulled up to $V_{DD}$, resulting in $M_{12}$ being fully on, and the source voltage for $M_{12}$ at node $N_{622}$ will be pulled high. Integrator $C_{602}$ rapidly charges to $(V_{DD}-V_T)$ while $M_{12}$ is fully conducting. When $M_5$ is turned on (see FIG. 5), node $N_{516}$ would be rapidly pulled lower and $M_{12}$ is turned off. However, the charge stored in $C_{602}$ is temporarily "trapped" because the only discharge path is through current source $I_3$, and it has high input impedance. Integrator $C_{602}$ holds the voltage at node $N_{622}$ high after $M_{12}$ turns off. The "speed trap" or signal averaging effectively slows fast transient components of signal $S_{3h}$ at node $N_{622}$ ($N_{403a}$) by holding signal $S_{3h}$ close to the peak value. This provides comparator 700 (see FIG. 7) with a relatively stable input signal, and allows sufficient time for the comparator to perform its function.

Other embodiments of level shifter 600 and integrator 650 can be employed. Level shifter 600 can be any circuit configured to latterly shift (step down) signal $S_{2h}$ where a high impedance discharge path is created when the input signal ($S_{2h}$) decreases sufficiently low. Integrator 650 can be any device or circuit capable of integrating AC components of signals $S_{3h}$ to a degree necessary for comparator 700 to function without generating a false LVDS fault condition signals ($S_A,S_B$). In addition to the capacitor illustrated in FIG. 6, alternative embodiments of integrator 650 include an op amp circuit, an op amp arranged with a capacitor to provide an integrator function, and parasitic capacitances of a transistor.

Figure 7:
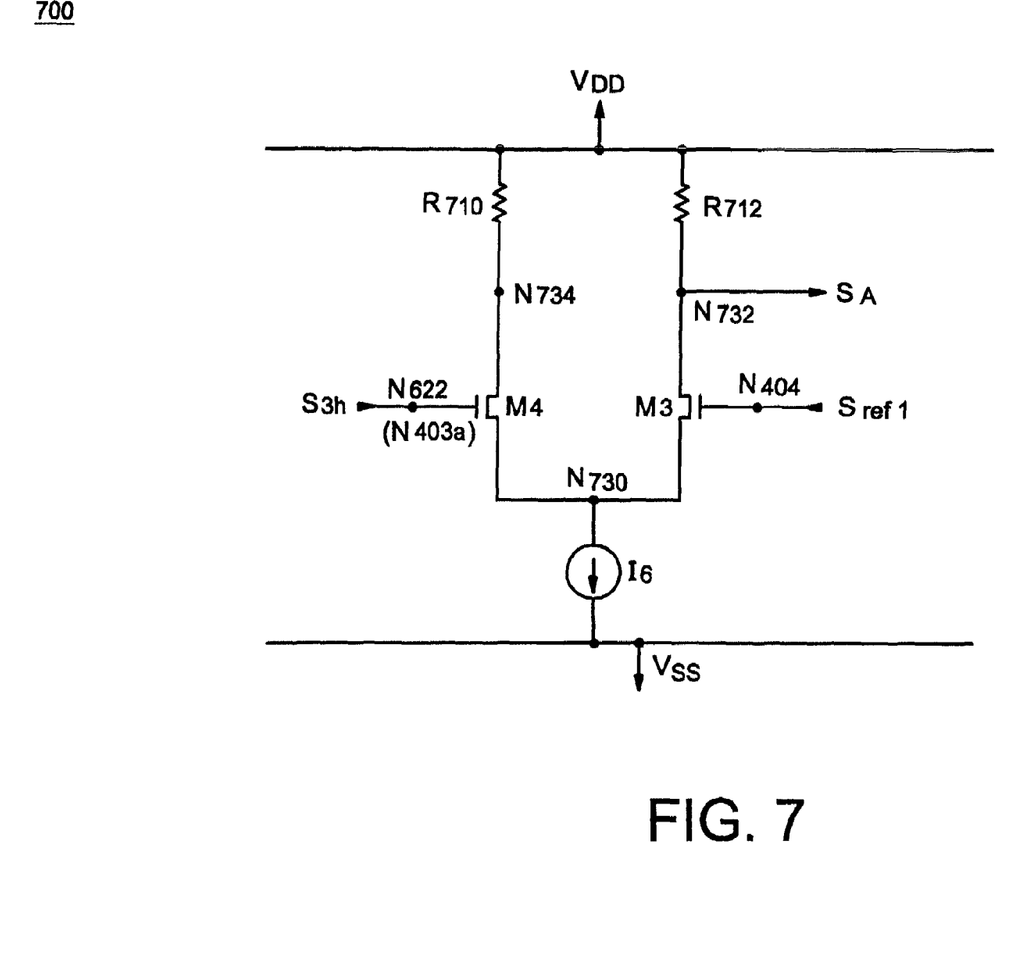
FIG. 7 is a schematic diagram of an exemplary comparator.

FIG. 7 illustrates a schematic diagram of comparator 700 according to an embodiment of the invention. A preferred embodiment of the LVDS fault condition detector employs more than one comparator as shown in FIG. 4. Comparator 440a forms part of the path analyzing $S_{ih}$, and comparator 440b forms part of the path analyzing $S_{il}$. FIG. 7 illustrates a preferred embodiment of a comparator according to the invention.

Comparator 700a comprises resistive loads $R_{710}$ and $R_{712}$, differential pair transistors $M_3$ and $M_4$, and current source $I_6$. Transistor $M_3$ has a gate coupled to node $N_{404}$ ($S_{ref1}$), a drain coupled to node $N_{732}$ ($S_A$), and a source coupled to node $N_{730}$. Transistor $M_4$ has a gate coupled to node $N_{622}$ ($S_{3b}$), a drain coupled to node $N_{734}$, and a source coupled to node $N_{730}$. Resistive load $R_{710}$ is coupled between supply voltage $V_{DD}$ and node $N_{734}$. Resistive load $R_{712}$ is coupled between supply voltage $V_{DD}$ and node $N_{732}$. Current source $I_6$ is coupled between node $N_{730}$ and supply voltage $V_{SS}$, and maintains approximately a constant current for the operation of comparator 700.

In operation, $M_3$ and $M_4$ form a differential pair. A fixed reference signal, $S_{ref1}$, is applied to a gate of $M_3$. Single-ended signal $S_{3h}$ is applied to a gate of $M_4$. Restive loads $R_{710}$ and $R_{712}$ are sized to allow approximately equal current flow through the differential pair when $S_{3h}$ is substantially equal to $S_{ref1}$. When single-ended signal $S_{3h}$ rises above $S_{ref1}$ transistor $M_4$ has a larger gate-to-source voltage than transistor $M_3$ causing more current to be steered through transistor $M_4$ and less current to be steered through transistor $M_3$. As a result, signal $S_A$ at node $N_{732}$ is pulled up toward $V_{DD}$, resulting in a high comparator control signal $S_A$ when signal $S_{3h}$ is above $S_{ref1}$.

When single-ended signal $S_{3h}$ falls below $S_{ref1}$, transistor $M_3$ has a larger gate-to-source voltage than transistor $M_4$, causing less current to be steered through transistor $M_4$, and more current to be steered through transistor $M_3$. As a result, signal $S_A$ at node $N_{732}$ is pulled down toward $V_{SS}$, resulting in a low comparator control signal $S_A$ when signal $S_{3h}$ is below $S_{ref1}$.

FIG. 8 is a schematic diagram of an exemplary reference signal circuit 800 according to one embodiment of the invention and is an exemplary embodiment of reference signal circuit 450 shown in FIG. 4.

Reference signal circuit 800 includes resistors $R_{820}$, $R_{822}$, and $R_{824}$; transistors $M_{14}$, $M_{15}$, and $M_{16}$; and current sources $I_7$, $I_8$, and $I_9$.

Resistors $R_{820}$ and $R_{822}$ are coupled between local power supply $V_{DD}$ and nodes $N_{840}$ and $N_{842}$ respectively. Resistor $R_{824}$ is coupled between nodes $N_{842}$ and $N_{844}$. Transistor $M_{14}$ has a gate coupled to node $N_{840}$, a drain coupled to local power supply $V_{DD}$, and a source coupled to node $N_{404}$. Transistor $M_{15}$ has a gate coupled to local power supply $V_{DD}$, a drain coupled to node $N_{840}$, and a source coupled to node $N_{846}$. Transistor $M_{16}$ has a gate coupled to local power supply $V_{DD}$, a drain coupled to node $N_{844}$, and a source coupled to node $N_{848}$. Current sources $I_7$–$I_9$ are coupled between local power supply $V_{SS}$ and nodes $N_{404}$, $N_{846}$, and $N_{848}$, respectively. Transistors $M_{15}$–$M_{16}$ can be long channel devices that are arranged to act as resistors. $M_{14}$ and $I_7$ are arranged to operate as a follower.

In operation, transistors $M_{14}$ and $M_{15}$, resistor $R_{820}$, and current sources $I_7$ and $I_8$, provide signal $S_{ref1}$ used by comparator 700. Transistor $M_{15}$ functions as a voltage-controlled resistor, and in conjunction with resistor $R_{820}$ and current source $I_8$, form a controlled voltage drop from local power supply $V_{DD}$ at node $N_{840}$. Transistor $M_{14}$ functions as a source follower, has a gate biased at node $N_{840}$, and in conjunction with current source $I_7$, provides signal $S_{ref1}$, at node $N_{840}$. Transistors $M_{14}$ and $M_{15}$ are always enabled.

In operation, transistor $M_{16}$, resistors $R_{822}$ and $R_{844}$, and current source $I_9$, provide signal $S_{ref2}$ used by output circuit 900 in FIG. 9. Transistor $M_{16}$ has a gate biased at $V_{DD}$. Transistor $M_{16}$ functions as a voltage-controlled resistor, and in conjunction with resistors $R_{820}$ and $R_{824}$, and with current source $I_9$, forms another controlled voltage drop from local power supply $V_{DD}$, providing signal $S_{ref2}$ at node $N_{842}$. Transistor $M_{16}$ is always enabled.

In alternative embodiments, signals $S_{ref1}$ and $S_{ref2}$ can be provided by any voltage source configured to provide the required signal levels.

FIG. 9 illustrates a schematic diagram of output circuit 900 according to one embodiment of the invention, and is an embodiment of output circuit 460 as shown in FIG. 4.

Output circuit 900 includes transistors $M_9$, $M_{10}$, and $M_{11}$; resistive loads $R_{952}$ and $R_{954}$; and current source $I_{10}$. Transistor $M_9$ has a gate coupled to node $N_{732}$ ($S_A$), a drain coupled to node $N_{952}$ and a source coupled to node $N_{956}$. Transistor $M_{10}$ has a gate coupled to node $N_{950}$ ($S_B$), a drain coupled to node $N_{952}$ ($S_{CH}$), and a source coupled to node $N_{956}$. Transistor $M_{11}$ has a gate coupled to node $N_{842}$ ($S_{ref2}$), a drain coupled to node $N_{954}$ ($S_{CL}$) and a source coupled to node $N_{956}$. Current source $I_{10}$ is coupled between node $N_{956}$ and local power supply $V_{SS}$. Resistive loads $R_{952}$ and $R_{954}$ are coupled between local power supply $V_{DD}$ and nodes $N_{952}$ and $N_{954}$ respectively.

In operation, output circuit 900 is similar to a wired NOR gate, or a three output comparator. A differential pair is formed by transistor $M_{11}$ and the parallel pair of transistors $M_9$ and $M_{10}$. Resistive loads $R_{952}$ and $R_{954}$ are approximately equal and function as pull-up devices for nodes $N_{952}$ and $N_{954}$, respectively. Current source $I_{10}$ provides a constant current source at node $N_{956}$, which is coupled to the sources of transistors $M_9$, $M_{10}$, and $M_{11}$. Signal $S_{ref2}$ is applied to a gate of transistor $M_{11}$, and provides a uniform $M_{11}$ gate-to-source bias voltage to establish the level of signal $S_{CL}$ at node $N_{954}$. Transistor $M_{11}$ is always enabled.

In normal LVDS condition, either transistor $M_9$ or $M_{10}$ is on and steering current away from transistor $M_{11}$. As a result, the current through resistive load $R_{954}$ decreases, and fault condition control signal $S_{CL}$ is pulled high toward $V_{DD}$. The current through resistive load $R_{952}$ increases, and fault condition control signal $S_{CH}$ is pulled low toward $V_{SS}$. The components are sized so that this results in $S_{CH}$ being lower than $S_{CL}$, indicating a normal LVDS condition. In a LVDS fault condition, both transistors $M_9$ and $M_{10}$ are off and all of current $I_{10}$ flows through transistor $M_{11}$. As a result, the current through resistive load $R_{954}$ increases, and fault condition control signal $S_{CL}$ is pulled low toward $V_{SS}$. The current through resistive load $R_{952}$ decreases, and fault condition control signal $S_{CH}$ are pulled high toward $V_{DD}$. Components $M_9$, $M_{10}$, $M_{11}$. $R_{952}$, $R_{954}$, and $I_{10}$ are sized so that fault detection signal $S_{CH}$ is greater than $S_{CL}$ when Sa and Sb are low. In an alternative embodiment, the transistors are scaled with respect to each other such that transistors $M_{11}$ and $M_{12}$ are twice the capacity of $M_9$ (i.e., $((W/L)_{11}=(W/L)_{12}=2\times(W/L)_9)$. In an alternative embodiment, the component parameters of output circuit 900 are sized so that the difference between signal $S_{CH}$ and signal $S_{CL}$ is approximately 600 mV.

Many types of wired NOR gates, or three input comparators, can be used to generate fault condition control signals $S_{CH}$ and $S_{CL}$.

FIG. 10 illustrates a schematic diagram of LVDS fault condition detector 1000 according to a preferred embodiment of the invention, and combines the preferred embodiments illustrated in FIGS. 5–9 into one circuit. FIG. 10 also illustrates a preferred embodiment of LVDS fault condition detector 400 illustrated in the block diagram of FIG. 4. FIG. 10 also schematically illustrates a fault condition detector processing both the $S_{ih}$ and $S_{il}$, sides of a LVDS differential signal. Where fault condition detector 1000 employs two devices, one for the $S_{ih}$ side and another for the $S_{il}$ side of a differential signal, the two similar devices are shown by "a" and "b" suffixes. For example, fault condition detector 1000 employs two comparators of the type illustrated in FIG. 700. The comparator for the $S_{ih}$ side is designated 700a and the comparator for the $S_{il}$ side is designated 700b. Similar components are similarly labeled.

LVDS fault condition detector 1000 comprises input buffer 500, two level shifters and integrators 600a and 600b, two comparators 700a and 700b, reference signal supply 800, and output stage 900. The above elements are enclosed in dashed boxes on FIG. 10. Current sources for the elements are not included within the dashed boxes for clarity. The components of LVDS fault condition detector are coupled and function as described in FIGS. 4–9.

The above specification, examples and data provide a complete description of the manufacture and use of the composition of the invention. Since many embodiments of the invention can be made without departing from the spirit and scope of the invention, the invention resides in the claims hereinafter appended.

We claim:

1. An apparatus for detecting a fault condition in a differential signal having a valid common-mode voltage, comprising:

an input buffer circuit that is arranged to produce a first buffered signal and second buffered signal in response to the differential signal;

a first comparator circuit that is arranged to produce a first signal in response to the first buffered signal and a first reference signal;

an integrator that is arranged to provide a first integrated signal in response to the first buffered signal, and the first comparator circuit is arranged to produce the first signal in response to the first integrated signal and the first reference signal, whereby the integrator operates as a speed trap, and wherein the integrator includes a level shifter circuit and a capacitance circuit, the level shifter circuit providing isolation between the input buffer circuit and the capacitance circuit, and the capacitance circuit is arranged to average the first buffered signal;

a second comparator circuit that is arranged to produce a second signal in response to a second buffered signal and second reference signal; and an output circuit that is arranged to produce a fault detection signal in response to the first signal and the second signal, whereby the fault detection signal indicates the fault condition that is due to at least one of a short condition, an open condition, and a termination by abnormal means.

2. An apparatus as in claim 1, wherein the first reference signal and the second reference signal are the same.

3. An apparatus as in claim 1, wherein detecting the fault condition occurs without loading, altering, or disturbing the signal source.

4. A method for detecting a fault condition in a differential signal having a valid common-mode voltage, the method comprising:
producing a first buffered signal and a second buffered signal in response to the differential signal;
generating a first signal when the amplitude of the first buffered signal meets a first predetermined criteria;
employing an integrator to generate a first integrated signal in response to the first buffered signal, and the generation of the first signal occurs in response to the first integrated signal and the first reference signal, and wherein a level shifter provides for isolation between the first and second buffered signals and a capacitance circuit that is arranged to average the first buffered signal;
generating a second signal when the amplitude of the second buffered signal meets a second predetermined criteria; and
producing a fault detection signal in response to the first signal and the second signal, wherein the fault detection signal indicates the fault condition when the amplitude of the differential signal is below a predetermined amplitude level.

5. A method as in claim 4, further comprising detecting the fault condition occurs without loading, altering, or disturbing the signal source.

6. A method as in claim 4, wherein the first predetermined criteria is the same as the second predetermined criteria.

7. A method as in claim 4, wherein the first predetermined criteria corresponds to the first buffered signal being below a predetermined signal level.

8. A method as in claim 4, wherein the first predetermined criteria corresponds to the first buffered signal being above a predetermined signal level.

9. A method as in claim 4, further comprising averaging at least one of the first buffered signal and the second buffered signal with a corresponding integrator.

10. An apparatus for detecting a fault condition in a differential signal having a valid common-mode voltage, comprising:
a buffering means that is arranged to provide a first and second buffered signal in response to the differential signal;
a first comparison means that is arranged to produce a first signal in response to a comparison between the first buffered signal and a first reference signal;
an integration means that is arranged to provide a first integrated signal in response to the first buffered signal, and the first comparison means is arranged to produce the first signal in response to the first integrated signal and the first reference signal, whereby the integration means operates as a speed trap, and wherein the integration means includes a level shifter means and a capacitance means, the level shifter means providing isolation between the buffering means and the capacitance means, and the capacitance means being arranged to average the first buffered signal;
a second comparison means that is arranged to produce a second signal in response to a comparison between the second buffered signal and second reference signal; and
an output means that is arranged to produce a fault detection signal in response to the first signal and the second signal, such that the fault detection signal indicates the fault condition that is due to at least one of a short condition, an open condition, and a termination by abnormal means.

11. An apparatus as in claim 10, wherein detecting the fault condition occurs without loading, altering, or disturbing the signal source.

* * * * *

UNITED STATES PATENT AND TRADEMARK OFFICE
CERTIFICATE OF CORRECTION

PATENT NO. : 6,943,591 B1
DATED : September 13, 2005
INVENTOR(S) : Douglas M. Hannan et al.

It is certified that error appears in the above-identified patent and that said Letters Patent is hereby corrected as shown below:

Column 5,
Line 36, delete "$N_{301}$," and insert -- $N_{301}$ --.

Column 8,
Line 45, delete "$S_{21}$," and insert -- $S_{21}$ --.
Line 46, delete "$S_{il}$," and insert -- $S_{il}$ --.

Column 10,
Line 17, delete "$(S_{3b})$" and insert -- $(S_{3h})$ --.

Column 11,
Line 5, delete "$S_{refl}$," and insert -- $S_{refl}$ --.

Column 12,
Line 11, delete "$S_{il}$," and insert -- $S_{il}$ --.

Signed and Sealed this

Twenty-fourth Day of January, 2006

JON W. DUDAS
*Director of the United States Patent and Trademark Office*